United States Patent
Spencer et al.

(10) Patent No.: US 10,225,940 B2
(45) Date of Patent: Mar. 5, 2019

(54) HANDLE FOR A DRAWER

(71) Applicant: HEWLETT PACKARD ENTERPRISE DEVELOPMENT LP, Houston, TX (US)

(72) Inventors: Stephen Spencer, Houston, TX (US); Belgie B. McClelland, Houston, TX (US); David A. Selvidge, Houston, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/523,366

(22) PCT Filed: Oct. 30, 2014

(86) PCT No.: PCT/US2014/063146
§ 371 (c)(1),
(2) Date: Apr. 28, 2017

(87) PCT Pub. No.: WO2016/068936
PCT Pub. Date: May 6, 2016

(65) Prior Publication Data
US 2017/0251560 A1    Aug. 31, 2017

(51) Int. Cl.
*H05K 5/00* (2006.01)
*H05K 5/02* (2006.01)
(Continued)

(52) U.S. Cl.
CPC ............ *H05K 5/023* (2013.01); *G06F 1/181* (2013.01); *G06F 1/183* (2013.01); *H05K 5/0221* (2013.01); *H05K 7/1489* (2013.01)

(58) Field of Classification Search
None
See application file for complete search history.

(56) References Cited

U.S. PATENT DOCUMENTS

| 4,941,841 A | * | 7/1990 | Darden | G06F 1/184 |
| | | | | 361/679.39 |
| 5,417,513 A | * | 5/1995 | Hayashi | H01R 13/62938 |
| | | | | 403/321 |

(Continued)

FOREIGN PATENT DOCUMENTS

| CN | 102700883 | 10/2012 |
| CN | 202745538 | 2/2013 |

(Continued)

OTHER PUBLICATIONS

"Rack- 2100G / Rack-21U0Gr 2U Rackmount Chassis," IEI Technology Corp., http://www.ieiworld.com/files/file_pool/0D243000170245676258/file/RACK-2100_QIG_v1.01.>.

(Continued)

*Primary Examiner* — Courtney Smith
*Assistant Examiner* — Rashen E Morrison
(74) *Attorney, Agent, or Firm* — International IP Law Group, PLLC

(57) ABSTRACT

Example implementations relate to a handle made of a single metal sheet. In one example, the handle includes a plurality of chamfered edges where each edge includes a first side and a second side. The handle includes a rolled-over top cover and a rolled bottom edge disposed between each of the plurality of chamfered edges. The handle also includes a latching extension disposed adjacent to each of the plurality of chamfered edges. The latching extension of the handle includes a pivot hole, an engaging indentation, and a hook located at an endpoint of the latching extension.

13 Claims, 8 Drawing Sheets

(51) Int. Cl.
  *G06F 1/18* (2006.01)
  *H05K 7/14* (2006.01)

(56) References Cited

U.S. PATENT DOCUMENTS

| | | | |
|---|---|---|---|
| 5,563,767 A | | 10/1996 | Chen |
| 6,017,106 A | * | 1/2000 | Adams .................. A45C 13/22 |
| | | | 312/223.2 |
| 6,018,456 A | | 1/2000 | Young |
| 6,374,460 B1 | * | 4/2002 | Edevold ................ A45C 13/26 |
| | | | 16/422 |
| 7,422,457 B1 | * | 9/2008 | Wu ....................... G02B 6/4201 |
| | | | 439/258 |
| 8,238,117 B2 | | 8/2012 | Burwell |
| 9,523,826 B2 | * | 12/2016 | Tsai ....................... G02B 6/423 |
| 2003/0161114 A1 | | 8/2003 | Berry |
| 2005/0018979 A1 | * | 1/2005 | Mizue .................. G02B 6/4277 |
| | | | 385/92 |
| 2007/0223207 A1 | | 9/2007 | Nguyen |
| 2011/0095497 A1 | | 4/2011 | Fan |

FOREIGN PATENT DOCUMENTS

| | | |
|---|---|---|
| CN | 203193168 | 9/2013 |
| TW | 201203283 | 1/2012 |

OTHER PUBLICATIONS

PCT/ISA/KR, International Search Report dated Jun. 16, 2015, PCT/US2014/063146, 11 pps.

\* cited by examiner

200A

500A

HANDLE FOR A DRAWER

BACKGROUND

A computing center may often contain several electronic components in a computer rack. In particular, the computing center may contain numerous electronic components stored in drawers within the computer rack. The drawers may be placed in various locations within the computer rack, including upper and lower regions of the rack. Various handle designs may be utilized to provide a user with a mechanism to open the drawers to reveal the contents located within.

DETAILED DESCRIPTION

A user may desire access to electronic components stored within a drawer of a computing device that is located in a rack unit. For example, storage hardware devices, e.g., hard disk drives, may be one type of electronic component stored in the drawer. A user may desire to access the hard disk drives within the drawer for possible removal, repair, or replacement. Thus, it may be advantageous to provide the user with accessibility to the electronic components regardless of the location of the computing device in the rack unit.

A chassis is a physical frame for the computing device that houses many of the electronic components and may be configured for installation in the rack unit, thus, forming a rack-mounted computer device. For example, several chassis may be mounted within the rack unit to allow for the mounting of multiple electronic components. In particular, the chassis may include a drawer to hold the multiple components. However, the chassis may be located in various areas within the rack unit such as top, middle, or bottom regions, where such locations may not be easily accessible to the user. As a result, the user may find it difficult or uncomfortable to access the drawers for possible removal, repair, or replacement of the electronic components within.

Examples described herein provide a handle for a drawer within an enclosure. The handle may be designed to include a rolled-over top cover to block a user from accessing the handle from above and a rolled bottom edge to promote a user to initiate an underneath grip of the handle. A latching extension of the handle may include pivot holes, engaging indentations, and hooks located on each side of handle to promote upward rotation of the handle in an effort to remove the drawer from within the enclosure. Thus, if the drawer is located in a difficult to reach area, the design of the handle may improve accessibility to the contents of the drawer. Additionally, the design of the handle may lessen the occurrence that a user may remove an entire chassis from a rack unit in an effort to inspect the contents of the drawer.

Figure 1:
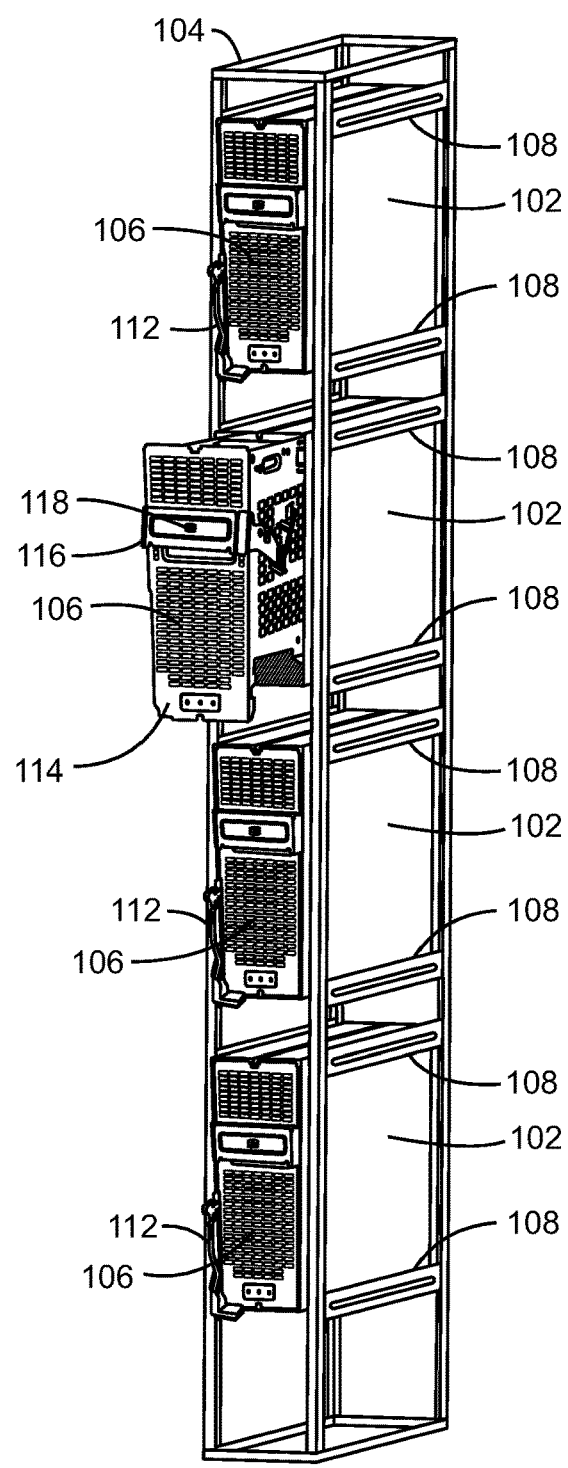
FIG. 1 is a perspective view of a computing device including a chassis mounted within a rack and a drawer located within the chassis, according to an example.

FIG. 1 is a perspective view of a computing device 100 including a chassis 102 mounted within a rack 104 and a drawer 106 located within the chassis 102. The chassis 102 may be an enclosure that serves as a structural support for various electronic components housed within the computing device 100. As shown in FIG. 1, the rack 104 may be used as a frame to support several chassis 102, via rack rails 108. As depicted, the rack rails 108 may be disposed in a horizontal direction on each side surface of the rack 104. Thus, the rack rails 108 may be located and attached to each side of an internal surface of the chassis 102 for stabilization of each chassis 102 during its insertion and removal. In particular, each side surface of the internal surface may include side rails (not visible in FIG. 1) that mate with the rack rails 108. The chassis 102 may be designed to house the drawers 106. Each drawer 106 may be used to store electronic components such as the hard disk drives, servers, modems, and expansion boards, among other electronic components.

The height of the rack 104 can vary from a few inches to a floor mounted rack of several feet in height. As a result, it may be difficult to access some of the drawers 106 mounted at various elevations within the rack 104. For example, the chassis 102 can be mounted in a substantially upper portion of the rack 104, a substantially lower portion of the rack 104, or a combination of both. Thus, a user may find it difficult to access the drawers 106 for possible removal, replacement, or repair, of the electronic components. In some cases, each chassis 102 may include a lever handle 112, which may be situated near a lower portion of an external front face 114 of the drawer 106. The lever handle 112 may be used to release the entire chassis 102 from within the rack 104. Each drawer 106 may include a handle 116, used to release the drawer 106 from within the chassis 102 to reveal the contents of the drawer 106. The handle 116 may be disposed on the external front face 114 of the drawer 106.

Regardless of the location of the drawer 106, the design associated with each handle, 112 or 116, may offer accessibility, identification, and comfort during use. The various components of the handle 116 used to release the drawer 106 from its chassis 102 and its associated mechanisms will be discussed in further detail with respect to FIGS. 2A, 2B, 3, 4A, 4B, 5A, and 5B.

Further, a visual cue 118 may be located in a center location of each handle 116 that may provide an indication as to the particular contents of the drawer 106. For example, if the user desires to access a particular drawer that contains hard disk drives, the visual cue 118 on the handle 116 may depict several disks to indicate that the drawer 106 stores hard disk drives. As a result, the user may be less likely to select another drawer 106, which stores a different type of computer component.

Figure 2A:
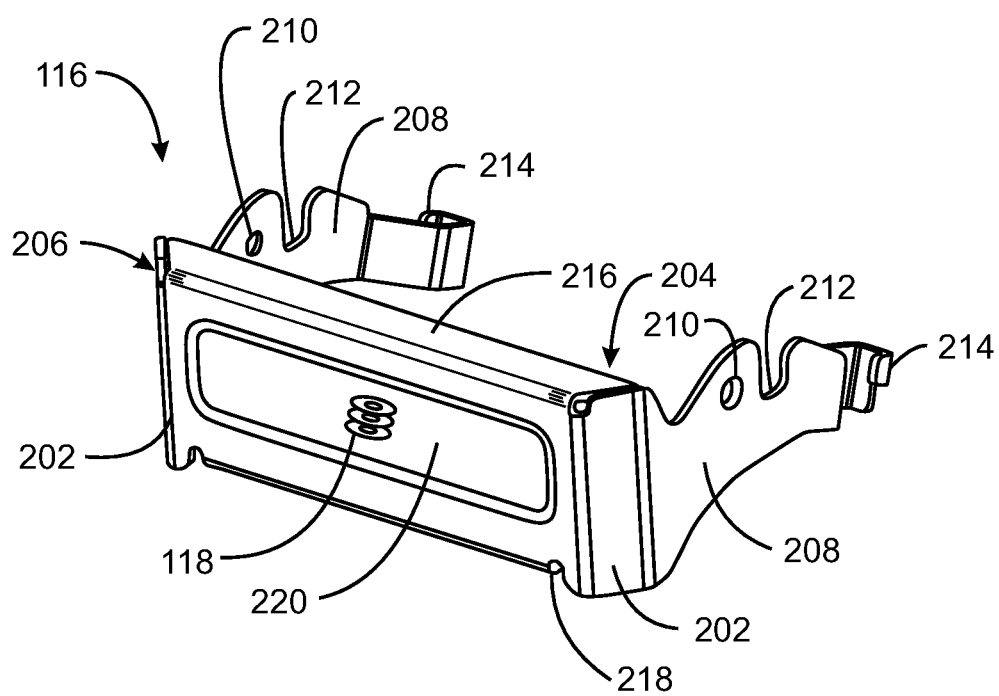
FIGS. 2A and 2B illustrate a front perspective view and a back perspective view of a handle of the drawer, respectively, according to an example.
Figure 2B:
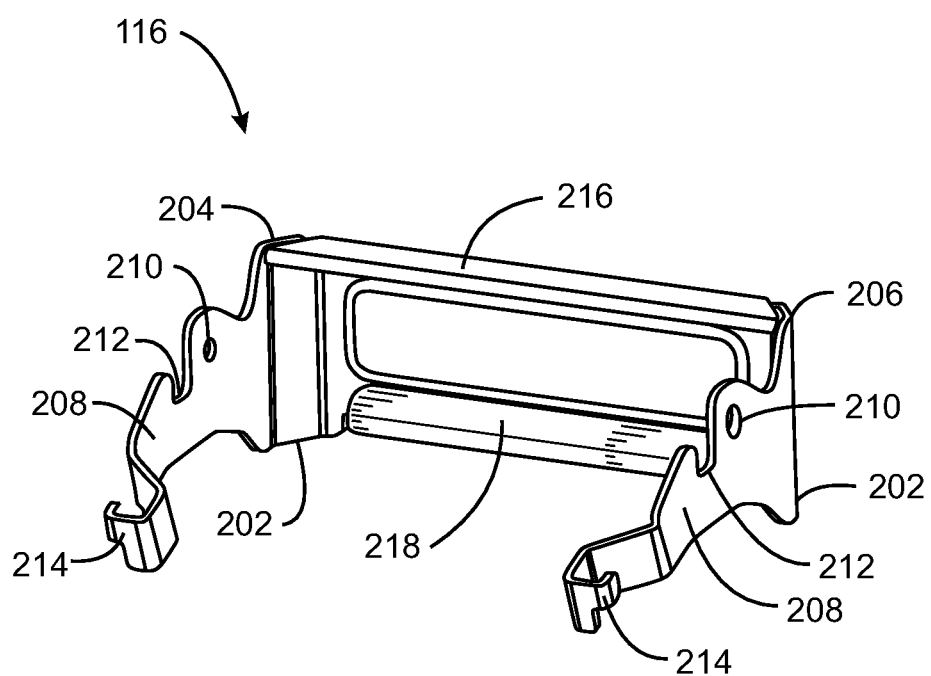

FIGS. 2A and 2B illustrate a front perspective view 200A and a back perspective view 200B of a handle of the drawer, respectively. Like numbered items are as described with respect to FIG. 1. The handle 116 may be shaped to include chamfered edges 202. The chamfered edges 202 may be located on a first side 204 and a second side 206 of the handle 116, where the second side 206 is opposite the first side 204. A latching extension 208 of the handle 116 may extend on both the first side 204 and the second side 206 and may include a pivot hole 210, an engaging indentation 212, and a hook 214. The pivot hole 210, the engaging indentation 212, and the hook 214 may be mechanically designed to operate with components of the drawer 106 and the chassis 102 to release the drawer 106 from the chassis 102.

The handle 116 may be shaped to provide a rolled-over top cover 216 disposed between and located at top portions of the chamfered edges 202. The design of the rolled-over top cover 216 may hinder access to the area between the back of the rolled-over top cover 216 and an external front face 114 of the drawer 106. Instead, the user may grasp the handle 116 along a rolled bottom edge 218 to open the drawer 106. The rolled bottom edge 218 is disposed between and located at bottom portions of the chamfered edges 202. Specifically, the design of the rolled bottom edge 218 of the handle 116 provides a secure under-handed grip.

In some cases, the handle 116 may include a depressed center region 220 that may be used as an identification platform to identity of the type of contents within the drawer 106. The depressed center region 220, for example, may depict as shown in FIG. 2, a visual cue 118 of the contents, for example, a graphic with several disks, to signify that the drawer 106 contains hard disk drives. Based on the nature of the contents, the visual cue 118 may provide notice that the drawer 106 includes other electronic components including processors, network cards, switches, servers, and modems, among others.

As shown in FIG. 2B, the rolled-over top cover 216 may extend backwards to top portions of a first side 204 and a second side 206 of chamfered edges 202. The rolled bottom edge 218 is angled in a downward direction to guide the user to initiate a gripping action of the handle 116. Other components of the handle 116 used to provide functionality will be discussed in further detail with respect to FIGS. 3, 4A, and 4B.

Figure 3:
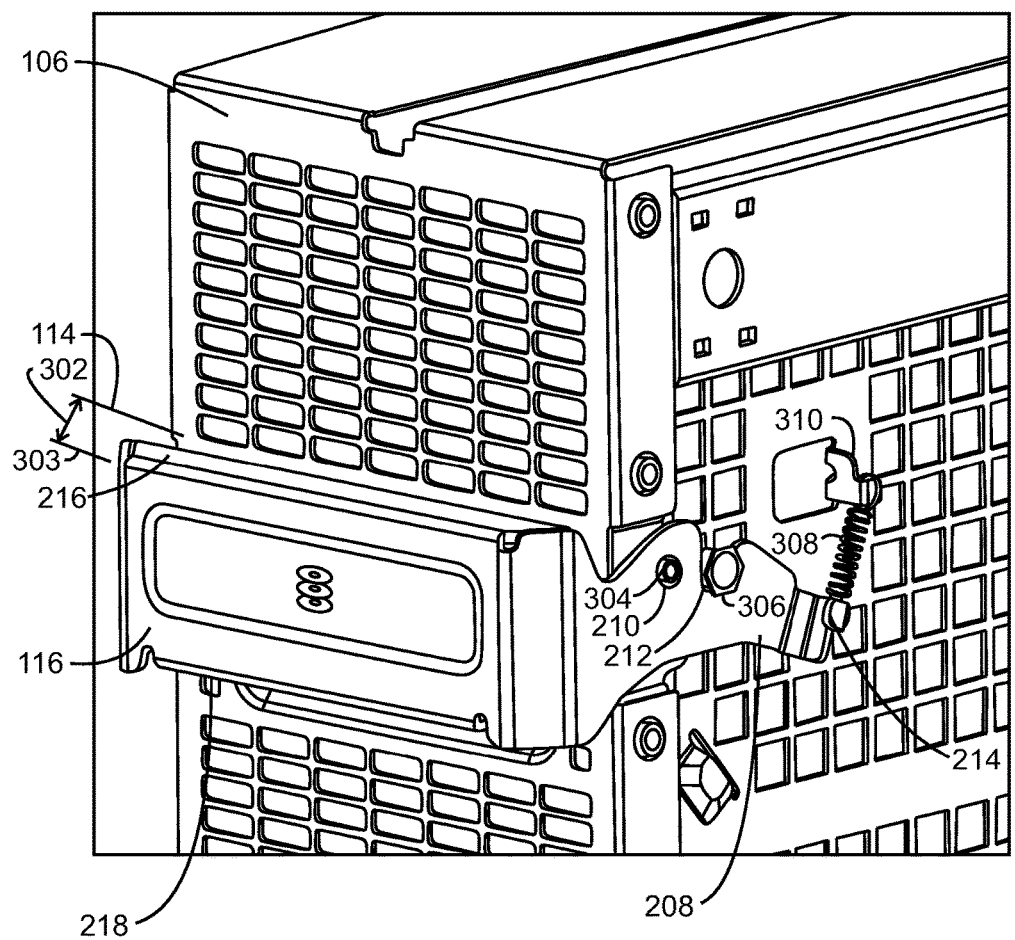
FIG. 3 is a perspective view of the drawer, including the attachment of the handle, according to an example.

FIG. 3 is a perspective view 300 of the drawer 106, including the attachment of the handle 116. Like numbered items are as described with respect to FIGS. 1, 2A, and 2B.

The handle 116 may have a low-profile dimension 302 measured from the external front face 114 of the drawer 106 to a front face 303 of the handle 116. The low-profile dimension 302 may hinder a user from using their fingers to grip the handle at the location of a rolled-over top cover 216. The low-profile dimension 302 ranges from about 12 mm to about 16 mm. A rolled bottom edge 218 of the handle 116 may provide a grip designed to instruct the user to grasp the handle 116 at its location. Once the user initiates the grasp, the shape of the rolled bottom edge 218 may guide the user to substantially grip the handle 116.

The handle 116 may be mechanically designed to operate in tandem with the drawer 106 in order to release the drawer 106. As shown in FIG. 3 a pivot hole 210 of the handle 116 may be attached to a pivot point 304 of the drawer 106 to provide attachment between the handle 116 and the drawer 106. A latch point 306 of the chassis 102 may be designed to mate with an engaging indentation 212 of the handle 116 that pivots about the latch point 306 when the handle 116 is lifted upwards. To provide a spring action, e.g., to return the handle 116 to the locked position shown in FIG. 3, a hook 214 may be disposed at an end of the latching extension 208 where one end of a spring member 308 attaches to the hook 214. As shown in FIG. 3, a second end of the spring member 308 may be connected to a connector 310 disposed on the sidewall of the drawer 106.

The handle 116 can be made from a single sheet of metal. Further, the handle may be fabricated using various metal shaping techniques, such as hammering, punching, stamping, and bending, among others. The material of the metal may include steel, stainless steel and other alloys of steel, aluminum, and other types of metals. In some aspects, the use of a single sheet of metal may lower the number of parts associated with the handle 116.

Figures 4A, 4B:
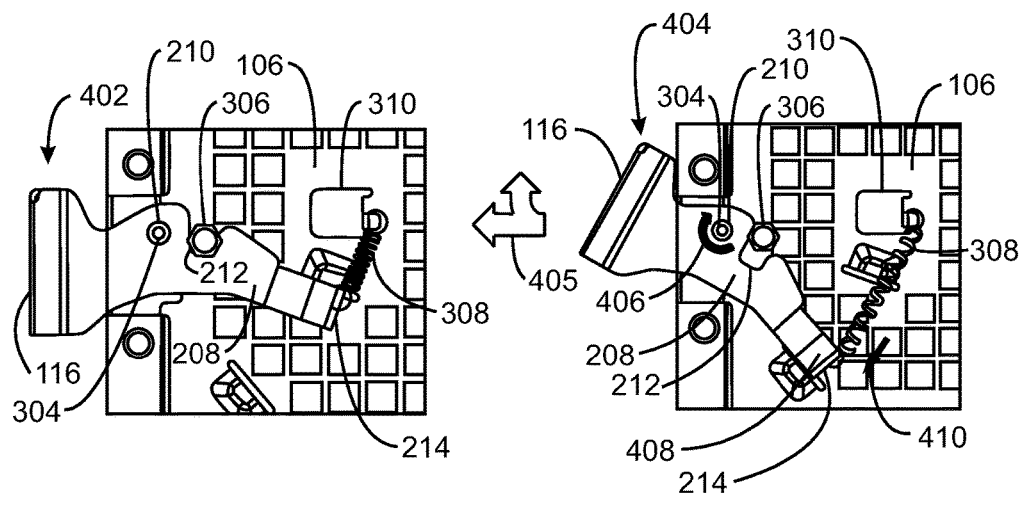
FIGS. 4A and 4B illustrate side views of the handle mechanically connected to the drawer in a stationary position and in a lifted position, respectively, according to an example.

FIGS. 4A and 4B illustrate side views, 400A and 400B, of the handle 116 mechanically connected to the drawer 106 in a stationary position 402 and in a lifted position 404, respectively. Like numbered items are as described with respect to FIGS. 1, 2A, 2B, and 3. In the stationary position 402, a pivot point 304 disposed on sidewalls of the drawer 106 may be pivotally connected to a pivot hole 210 in the latching extension 208. A hook 214 of the handle 116 may accept one end of a spring member 308 of the drawer 106 where the other end of the spring member 308 is attached to a connector 310 located on a sidewall of the drawer 106. A latch point 306 of the chassis 102 may engage within an engaging indentation 212 of the handle 116, i.e., in a latching position, to act as a stopping mechanism for the handle 116 and to secure the drawer 106. In the latched position, the spring member 308 provides continuous pressure to hold the engaging indentation 212 of the handle 116 on the latch point 306.

When the handle is rotated upwards, as indicated by arrow 405, to release the drawer 106, as depicted in FIG. 4B, the latching extension 208 may pivotally rotate 406 about the pivot point 304 of the drawer 106. Simultaneously, an end portion 408 of the latching extension 208 may move downward so that the engaging indentation 212 disengages from the latch point 306. Since the end portion 408 of the latching extension 208 moves downward, the hook 214 located on the end portion 408 also moves downward. As a result, a length of the spring member 308 is extended, as depicted by arrow 410, to provide stability to the latching extension 208 as it moves downward.

Figure 5A:
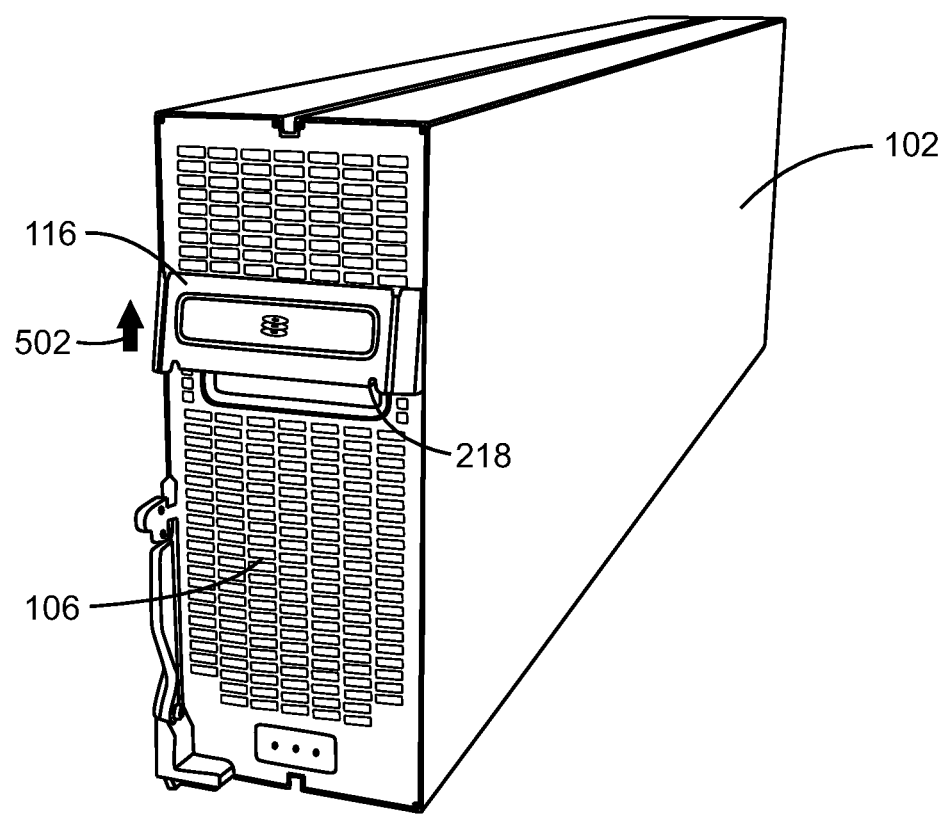
FIGS. 5A and 5B are perspective views of the handle extended in an upward direction and the drawer partially removed from within the chassis, respectively, according to an example.
Figure 5B:
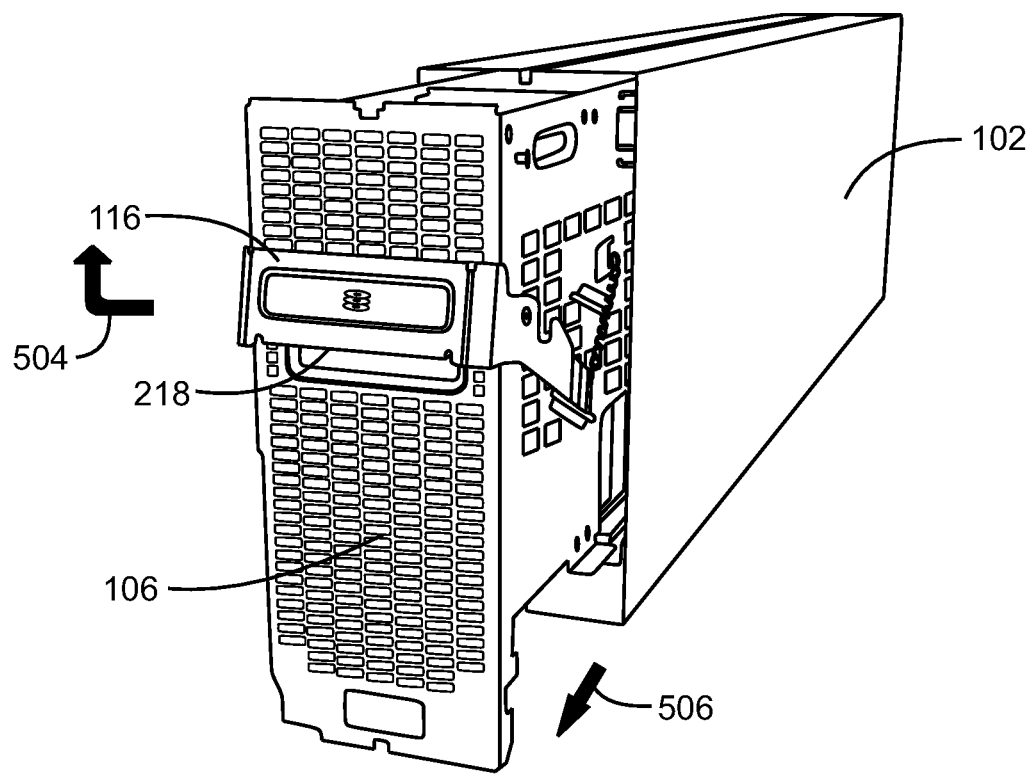

FIGS. 5A and 5B are perspective views, 500A and 500B, of the handle 116 extended in an upward direction and the drawer 106 partially removed from within the chassis 102. Like numbered items are as described with respect to FIGS. 1, 2A, 2B, 3, 4A, and 4B. To begin the release of the drawer 106, a user may grasp a rolled bottom edge 218 of the handle 116. The user may lift the handle 116 in an upward direction 502 to disengage the handle 116 from the drawer 106 and from the chassis 102. As shown in FIG. 5B, once the lifted position is initiated, the rolled bottom edge 218 of the handle 116 may be rotated upwards, as indicated by arrow 504. As a result, the user may slide the drawer 106 out of the chassis 102, as indicated by arrow 506, to reveal the contents of the drawer 106, as shown in FIG. 5B.

Figure 6:
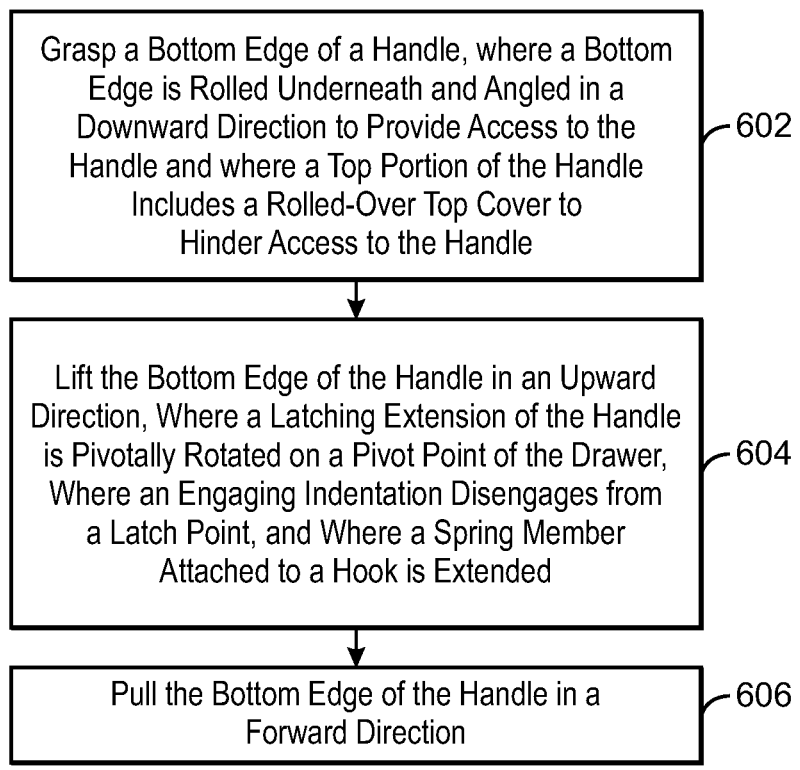
FIG. 6 is a method for opening a drawer within a chassis.

FIG. 6 is a method 600 for opening a drawer within a chassis. A bottom edge of a handle may be rolled underneath and angled in a downward direction. This design may instruct a user to grasp the handle in an effort to release the drawer from within the chassis. At block 602, a user may grasp the rolled bottom edge of the handle. The handle may include a rolled-over top cover designed to hinder access of the handle at its location. Hence, the user may not grasp the handle at the location of the rolled-over top cover. Once the user has a secure grip on the rolled bottom edge of the handle, at block 604, the user may lift the rolled bottom edge of the handle in an upward direction. Simultaneously, a latching extension of the handle may pivotally rotate on a pivot point of the drawer, an engaging indentation of the handle may disengage from a latch point of a chassis, and a spring member attached to one end of a hook of the handle may extend. The combination of the actions may disengage the drawer from the chassis. Continuing with the gripping action, the user, at block 606, may initiate a pulling action on the rolled bottom edge of the handle to pull the drawer in a forward direction to release the drawer from within the chassis. As a result, the user may access the contents inside of the drawer, if desired.

The invention claimed is:

1. A handle comprising a single metal sheet, wherein the single metal sheet comprises:
   a plurality of chamfered edges, wherein each of the chamfered edges comprise a first side and a second side and wherein the second side is opposite of the first side;
   a rolled-over top cover disposed between each of the plurality of chamfered edges and located at top portions of the first and second sides, wherein the rolled-over top cover blocks access to grip the handle;
   a rolled bottom edge disposed between each of the plurality of chamfered edges and located at bottom portions of the first and second sides, wherein the rolled bottom edge is to provide a grip;
   a latching extension disposed adjacent to each of the plurality of chamfered edges;
   a pivot hole located in the latching extension;
   an engaging indentation located in the latching extension; and
   a hook located at an endpoint of the latching extension, wherein the hook is attached to a first end of a spring member and wherein a second end of the spring member is attached to a connector.

2. The handle of claim 1, wherein the rolled bottom edge is angled downward to provide the grip.

3. The handle of claim 1, wherein the handle is to be lifted and pulled from the rolled bottom edge.

4. The handle of claim 1, wherein the handle comprises a low-profile of less than about 16 mm between a front face of the handle and an external front face of a drawer.

5. The handle of claim 1, wherein the latching extension rotates downward when the handle is rotated upward, releasing a latch point of a chassis.

6. An enclosure for a computing device, comprising
   a chassis;
   a plurality of rails located on each side of an internal surface of the chassis;
   a drawer aligned within the plurality of rails, wherein the drawer comprises:
      a handle located on an external front face of the drawer, wherein the handle comprises a single metal sheet comprising:
         a plurality of chamfered edges, wherein each of the plurality of chamfered edges comprise a first side and a second side and wherein the second side is opposite of the first side;
         a rolled-over top cover disposed between each of the plurality of chamfered edges and located at top portions of the first and second sides, wherein the rolled-over top cover blocks access to grip the handle; and
         a rolled bottom edge disposed between the plurality of chamfered edges and located at bottom portions of the first and second sides, wherein the rolled bottom edge is to provide a grip;
         a latching extension disposed adjacent to each of the plurality of chamfered edges;
         a pivot hole located in the latching extension;
         an engaging indentation located in the latching extension; and
         a hook located at an endpoint of the latching extension;
      a pivot point disposed on a sidewall of the drawer;
      a latch point disposed on the sidewall of the chassis; and
      a spring member connected to a connector disposed on the sidewall of the drawer, wherein a first end of the spring member is attached to the hook and wherein a second end of the spring member is attached to the connector.

7. The enclosure for the computing device of claim 6, wherein the rolled bottom edge is angled downward to provide the grip to grasp the handle and wherein the handle is to be rotated upwards and pulled forward to slide the drawer out of the chassis.

8. The enclosure for the computing device of claim 6, wherein the pivot point is pivotally connected to the pivot hole.

9. The enclosure for the computing device of claim 6, wherein the latch point on the chassis is engaged with the engaging indentation.

10. A method for opening a drawer within a chassis, comprising:
    grasping a bottom edge of a handle, wherein the bottom edge is rolled underneath and angled in a downward direction to provide access to the handle and wherein a top portion of the handle comprises a rolled-over top cover to hinder access to the handle;
    rotating the bottom edge of the handle in an upward direction, wherein:
       a latching extension of the handle is pivotally rotated on a pivot point of the drawer, wherein an engaging indentation disengages from a latch point, and wherein a spring member attached to a hook is extended, and
       the upward rotation of the rolled bottom edge of the handle extends a length of the spring member, wherein a first end of the spring member is connected to a connector of the drawer and a second end of the spring member is connected to a hook of the latching extension; and
    pulling the bottom edge of the handle in a forward direction.

11. The method of claim 10, wherein the grasping of the rolled bottom edge of the handle promotes a substantial gripping action.

12. The method of claim 10, wherein the pulling of the rolled bottom edge of the handle slides the drawer out of the chassis.

13. The method of claim 10, wherein the opening of the drawer provides access to contents within the drawer.

* * * * *